United States Patent [19]

Passerini et al.

[11] Patent Number: 5,736,778
[45] Date of Patent: Apr. 7, 1998

[54] SILICON RESISTOR WITH EXPANSION PLATE ELECTRODE

[75] Inventors: Bruno Passerini, Balangero; Silvestro Fimiani, Turin, both of Italy

[73] Assignee: International Rectifier Corporation, El Segundo, Calif.

[21] Appl. No.: 751,111

[22] Filed: Nov. 15, 1996

Related U.S. Application Data

[60] Provisional application No. 60/007,635 Nov. 28, 1995.
[51] Int. Cl.$^6$ ................................. H01L 29/00
[52] U.S. Cl. ................... 257/536; 257/537; 257/538; 257/768; 257/763
[58] Field of Search ........................ 257/536, 538, 257/551, 688, 537, 177, 768, 763

[56] References Cited

U.S. PATENT DOCUMENTS

| 5,021,867 | 6/1991 | Przybysz | 257/537 |
| 5,070,383 | 12/1991 | Sinar et al. | 257/537 |
| 5,652,460 | 7/1997 | Kalb et al. | 257/536 |

*Primary Examiner*—Mahshid D. Saadat
*Assistant Examiner*—S. V. Clark
*Attorney, Agent, or Firm*—Ostrolenk, Faber, Gerb & Soffen, LLP

[57] ABSTRACT

A high power resistor is formed of a wafer of silicon captured between two molybdenum electrodes. A P-I-N diode of ring shape or wafer shape is concentric with a silicon resistor and has surfaces which are coplanar with the silicon resistor to form a device having an integrated diode and resistor.

24 Claims, 1 Drawing Sheet

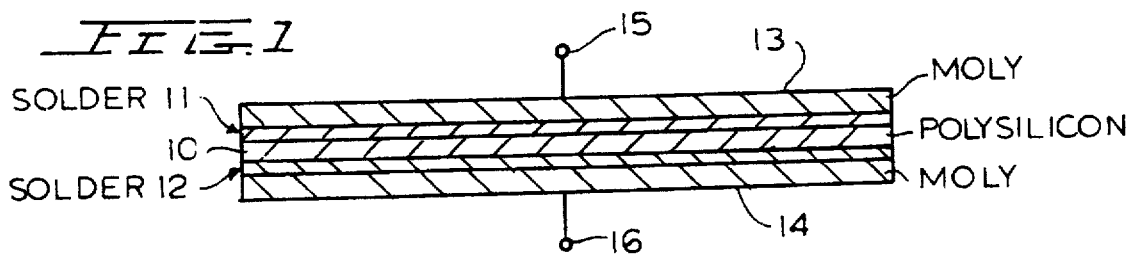
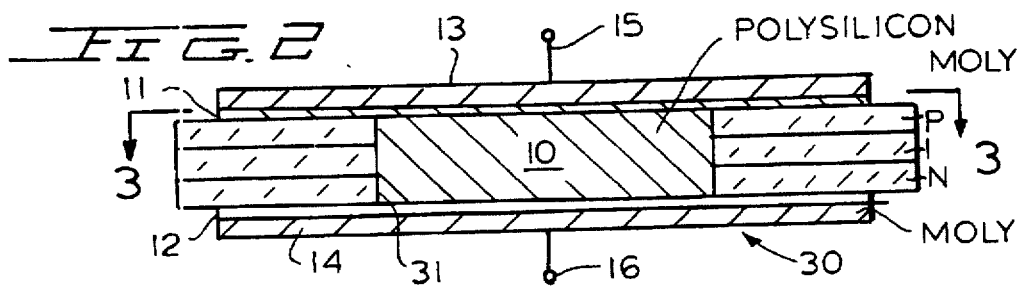
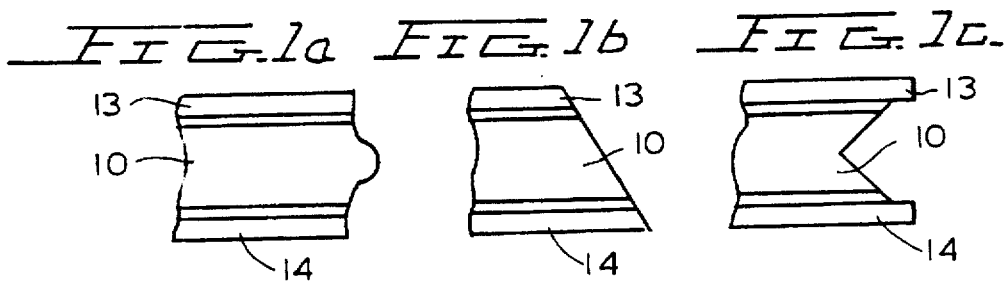
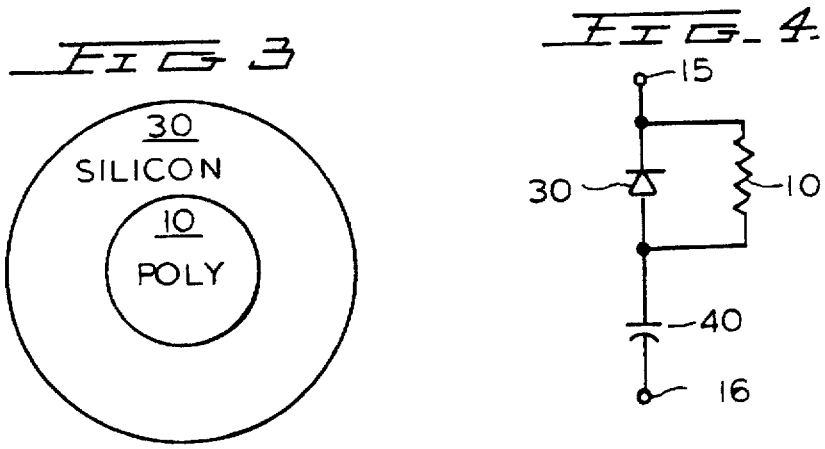
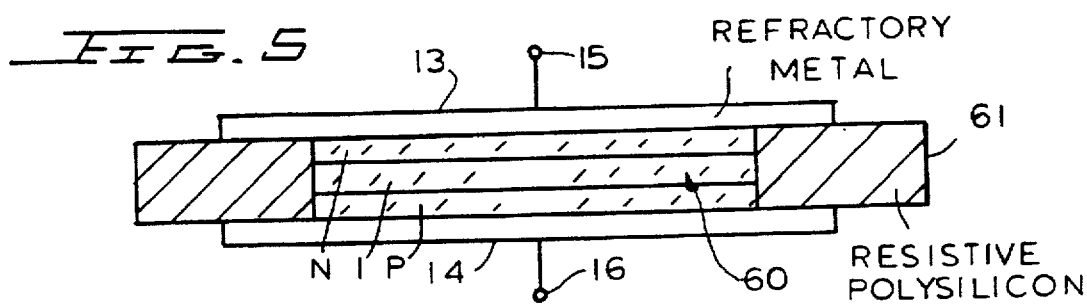

SILICON RESISTOR WITH EXPANSION PLATE ELECTRODE

BACKGROUND OF THE INVENTION

This invention is based on and claims the benefit of U.S. Provisional Application No. 60/007,635, filed 28 Nov. 1995.

This invention relates to high current resistor structures and to a combination of a resistor structure and diode which employs large area resistive silicon wafers and refractory metal expansion plates having a coefficient of thermal expansion which closely matches that of the silicon wafers. The silicon wafer to be used may be monocrystal or polycrystal (polysilicon), as desired, and the use of the term "silicon" herein is intended to encompass monocrystal and polycrystal material.

Resistors for high currents, for example, 10 to 50 amperes or more, and voltages of up to and in excess of 1,000 volts are available but require large volume and mass. Such resistors are commonly wire wound, and are discrete resistors. Furthermore, high current diodes requiring such parallel resistors are also in demand.

BRIEF SUMMARY OF THE INVENTION

The present invention relates to a novel high power resistor structure of small volume and mass which can be used alone or integrated with a high power diode. More specifically, the novel resistor of the invention consists of a high resistivity silicon (monocrystal or polycrystal) wafer with flat parallel opposing surfaces. A pair of refractory metal electrodes having flat surfaces are soldered to, or placed in high pressure contact with, respective ones of the opposite surfaces of the silicon wafer. The resistance of the device is dependent on the area and thickness of the silicon wafer and its resistivity. The thickness of the silicon wafer can be in the range of 0.3 to 2.5 millimeters, its area can be up to about 4,000 square millimeters, and its resistivity can be from 100 to 10,000 ohm centimeters.

In accordance with a second embodiment of the invention, a P-I-N diode wafer can be integrated with the silicon wafer resistor. The P-I-N diode can consist of an annular ring-shaped wafer of the same thickness as the silicon disk which fills the central opening in the diode ring. The diode wafer thickness and silicon wafer thickness are the same and both receive the same refractory metal electrode.

The refractory metals used may be such metals as molybdenum, tungsten and tantalum which have coefficients of expansion which are close to that of silicon and polysilicon. These metals may be soldered to the silicon and by soft solder wafers which will accommodate slight differences in thickness and flatness of the silicon wafers.

BRIEF DESCRIPTION OF THE DRAWINGS

FIG. 1 is a cross-sectional view of a resistor made in accordance with the present invention.

FIGS. 1a, 1b and 1c show different geometries for the silicon wafer of the invention.

FIG. 2 is a cross-sectional view of an embodiment of the invention in which a resistor is integrated with a diode.

FIG. 3 is a view of FIG. 2 taken across the section line 3—3 in FIG. 2.

FIG. 4 is a circuit diagram of the device of FIGS. 2 and 3.

FIG. 5 shows a second embodiment of the device of FIGS. 2 and 3.

DETAILED DESCRIPTION OF THE INVENTION

Referring first to FIG. 1, a conventional monocrystal or polycrystal silicon wafer 10 is grown by conventional techniques and is shaped to desired dimensions as by etching and lapping. Wafer 10 may have its resistivity controlled by controlled diffusion of phosphorus thereon, to have a resistivity ranging from 100 to 10,000 ohm centimeters, a thickness ranging from 0.3 to 2.5 millimeters and a diameter, if circular, of from 15 to 77 millimeters. Wafer 10 may also have a square, elongated, rectangular or any other desired topology. If desired, the silicon wafer can have a variable resistivity across its thickness. For example, a major portion of its thickness may be of very low resistivity, and a small portion of high resistivity. The high resistance portion can also be disposed in the center of the wafer thickness. The resistivity can also vary in non-step fashion over the thickness of the wafer. Thus, the wafer can be thick and strong, while still having a high resistance.

The upper surface of silicon wafer 10 is preferably lapped flat and parallel. Two soft solder disks 11 and 12 are placed on the opposite surfaces and are used to solder molybdenum electrodes 13 and 14, respectively, to the opposite respective surfaces of wafer 10. Electrodes 13 and 14 may have a thickness of about 0.3 to 5 millimeters.

Solder disks 11 and 12 may be 0.05 millimeters thick and can be any desired soft or hard solder which will wet and solder together the silicon and molybdenum surfaces of the device. Other refractory metals, which have a thermal coefficient of expansion similar to that of silicon, could be used in place of the molybdenum plates 13 and 14.

Any suitable connection can be provided for electrodes 13 and 14, shown as terminals 15 and 16, to enable easy connection to the electrodes 13 and 14.

In a typical resistor made in accordance with the invention, a silicon wafer 10 having a resistivity of 1,000 ohm centimeters, a diameter of 30 millimeters and a thickness of 0.7 millimeters will produce a resistor having a resistance of 10 ohms and a continuous current carrying capacity of about 15 amperes and a voltage rating of 1,000 volts.

The outer edge of the device can be passivated to reduce the possibility of breakdown at its edge, and the wafer thickness can be increased and its resistivity increased to obtain higher breakdown voltages. The outer peripheral edge can also be tapered or bulged out, as shown in FIGS. 1a, 1b and 1c, to reduce the possibility of breakdown at its edge.

If desired, a diode can be integrated with the resistor, as shown in FIGS. 2, 3 and 4, where parts similar to those of FIG. 1 have the same identifying numerals. In FIGS. 2 and 3, however, a P-I-N diode 30, in the shape of a disk with a central opening, is added to the structure. P-I-N diode 30 can be any other desired semiconductor structure.

In FIGS. 1 and 2, the diode 30 may have a current rating of 10 to 50 amperes or higher, and a reverse breakdown voltage of up to 1,000 volts. The silicon resistor 10 may have a resistance in parallel with diode 30, as shown in FIG. 4, of about 10 ohms. The capacitance between electrodes 13 and 14 is the capacitor 40 of FIG. 4. Thus, the novel structure provides a novel integrated diode 30 and parallel resistor 10 between terminals 15 and 16.

In one example, P-I-N diode is a wafer 30 with N and P diffusions in its opposite surfaces. The wafer 30 may have a thickness of 0.7 millimeters, an outside diameter of 40 millimeters, and an inside diameter of 30 millimeters. The silicon wafer 10 in FIGS. 1 and 2 has the same thickness as wafer 30, and an outside diameter less than 30 millimeters to nest inside of opening 31.

The outer periphery of wafer 30 may be tapered or shaped to increase its breakdown voltage, and may be passivated, as by glass or the like. A suitable insulation housing, not shown, can enclose the assembly of FIGS. 1 and 2.

FIG. 5 shows a second embodiment of FIG. 4, wherein the ring-shaped P-I-N diode of FIG. 2 is replaced by a disk-shaped wafer 60, while the silicon disk 10 of FIG. 3 is replaced by ring-shaped silicon disk 61.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A resistor comprising, in combination, a thin, flat wafer of silicon which is either monocrystal or polycrystal, and which has flat parallel surfaces and having a controlled impurity concentration to impart a predetermined resistivity to said wafer, a pair of refractory metal electrodes which are substantially coextensive with and in full surface contact with respective ones of said flat parallel surfaces of said wafer; said refractory metal electrodes having a coefficient of thermal expansion which is closely matched to that of said wafer; said refractory metal electrodes being spaced from one another by the full thickness of said wafer.

2. The resistor of claim 1 wherein said refractory metal electrodes are molybdenum.

3. The resistor of claim 1 wherein said refractory metal electrodes are soldered to said surface of said wafer.

4. The resistor of claim 3 wherein said refractory metal electrodes are molybdenum.

5. The resistor of claim 1 which further includes a flat wafer of single crystal silicon having flat parallel opposite surfaces and having a predetermined junction pattern therein and which has a thickness substantially identical to that of said wafer; said wafer of single crystal being laterally adjacent said wafer; said parallel opposite surfaces of said single crystal wafer being coplanar with respective ones of said flat parallel surfaces of said wafer; said pair of refractory metal electrodes being further coextensive with and in electrical contact with said parallel surfaces of respective ones of said single crystal wafer.

6. The resistor of claim 5 wherein said refractory metal electrodes are molybdenum.

7. The device of claim 1 wherein said refractory metal electrodes are soldered to said surfaces of said wafer and said single crystal silicon wafer.

8. The device of claim 5 wherein said wafer of single crystal silicon is a disk with a central opening; said wafer being disposed within said central opening.

9. The device of claim 5 wherein said wafer is a disk with a central opening; said single crystal silicon wafer being disposed within said central opening.

10. The device of claim 5 wherein said wafer of single crystal silicon has a junction pattern which defines a P-I-N diode.

11. The device of claim 8 wherein said wafer of single crystal silicon has a junction pattern which defines a P-I-N diode.

12. The device of claim 9 wherein said wafer of single crystal silicon has a junction pattern which defines a P-I-N diode.

13. The device of claim 11 wherein said refractory metal electrodes are soldered to said surfaces of said wafer and said single crystal silicon wafer.

14. The device of claim 12 wherein said refractory metal electrodes are soldered to said surfaces of said wafer and said single crystal silicon wafer.

15. An integrated diode and resistor structure comprising, in combination, a first thin, flat wafer of silicon having flat parallel surfaces and having a controlled impurity concentration to impart a predetermined resistivity to said first wafer; a pair of refractory metal electrodes which are substantially coextensive with and in full surface contact with respective ones of said flat parallel surfaces of said first wafer; said refractory metal electrodes having a coefficient of thermal expansion which is closely matched to that of said wafer; said refractory metal electrode being spaced from one another by the full thickness of said wafer; and a second flat wafer of single crystal silicon having flat parallel opposite surfaces and having a predetermined junction pattern therein and which has a thickness substantially identical to that of said first wafer; said second wafer of single crystal being laterally adjacent said first wafer; said parallel opposite surfaces of said second wafer being coplanar with respective ones of said flat parallel surfaces of said first wafer; said pair of refractory metal electrodes being further coextensive with and in electrical contact with said parallel surfaces of respective ones of said second wafer.

16. The device of claim 15 wherein said refractory metal electrodes are molybdenum.

17. The device of claim 15 wherein said refractory metal electrodes are soldered to said first and second wafers.

18. The device of claim 15 wherein said second wafer is a disk with a central opening; said first wafer being disposed within said central opening.

19. The device of claim 16 wherein said second wafer is a disk with a central opening; said first wafer being disposed within said central opening.

20. The device of claim 17 wherein said second wafer is a disk with a central opening; said first wafer being disposed within said central opening.

21. The device of claim 15 wherein said first wafer is a disk with a central opening; said second wafer being disposed within said central opening.

22. The device of claim 16 wherein said first wafer is a disk with a central opening; said second wafer being disposed within said central opening.

23. The device of claim 17 wherein said first wafer is a disk with a central opening; said second wafer being disposed within said central opening.

24. The device of claim 15 wherein said second wafer contains a junction pattern which defines a P-I-N diode.

* * * * *